US008202565B2

(12) United States Patent
Liu et al.

(10) Patent No.: US 8,202,565 B2
(45) Date of Patent: Jun. 19, 2012

(54) FLUX SPRAYING SYSTEM AND METHOD

(75) Inventors: Yun-Qi Liu, Shenzhen (CN); Jie Ge, Shenzhen (CN); Lei Nie, Shenzhen (CN)

(73) Assignees: Hong Fu Jin Precision Industry (ShenZhen) Co., Ltd., Shenzhen, Guangdong Province (CN); Hon Hai Precision Industry Co., Ltd., Tu-Cheng, New Taipei (TW)

( * ) Notice: Subject to any disclaimer, the term of this patent is extended or adjusted under 35 U.S.C. 154(b) by 373 days.

(21) Appl. No.: 12/603,647

(22) Filed: Oct. 22, 2009

(65) Prior Publication Data
US 2010/0252649 A1 Oct. 7, 2010

(30) Foreign Application Priority Data

Apr. 1, 2009 (CN) .......................... 2009 1 0301276

(51) Int. Cl.
*C23C 16/52* (2006.01)
*B05D 5/00* (2006.01)
*B23K 1/20* (2006.01)
*B05C 11/00* (2006.01)
*B05B 15/04* (2006.01)
*B05B 3/00* (2006.01)
(52) U.S. Cl. ............ 427/8; 118/665; 118/679; 118/504; 118/301; 118/323; 427/96.1; 427/282; 228/102; 228/103; 228/223
(58) Field of Classification Search .................. 118/665, 118/668, 672, 674, 321, 323, 682, 679, 681, 118/504, 505, 301, 305, 669, 680; 427/8, 427/424, 427.1, 427.2, 427.3, 421, 96.1; 228/102, 103, 223, 176, 179.1
See application file for complete search history.

(56) References Cited

U.S. PATENT DOCUMENTS
5,560,537 A * 10/1996 Sadler et al. .................. 228/102
5,938,848 A * 8/1999 Hogan et al. .................. 118/682

FOREIGN PATENT DOCUMENTS
| CN | 2774076 Y | | 4/2006 |
| JP | 6224546 A | | 8/1994 |
| JP | 7212019 A | | 8/1995 |
| JP | 11177226 A | * | 7/1999 |
| TW | 502665 | | 9/2002 |
| TW | I271249 | | 1/2007 |

OTHER PUBLICATIONS
Computer English Translation JP 11177226 A, Jul. 2, 1999.*

* cited by examiner

*Primary Examiner* — Yewebdar Tadesse
(74) *Attorney, Agent, or Firm* — Altis Law Group, Inc.

(57) ABSTRACT

A flux spraying system controls a flux sprayer to selectively spray soldering flux onto a printed circuit board (PCB) by a fixture. The fixture is disposed between the PCB and the flux sprayer, and comprises a plurality of openings corresponding to target areas of the PCB. The flux spraying system comprises a statistic module, a calculation module, and a control module. The statistic module records attributes of the fixture to determine spraying areas on the fixture. The calculation module calculates movement parameters of the flux sprayer, a movement length during a movement period and spraying segments of the flux sprayer, and spray duration of the flux sprayer based on the movement length during one movement period and the spraying segments of the flux sprayer. The control module directs the flux sprayer to coat the target areas of the PCB through the openings of the fixture.

6 Claims, 5 Drawing Sheets

FLUX SPRAYING SYSTEM AND METHOD

BACKGROUND

1. Technical Field

The disclosure generally relates to production control technologies, and more particularly to a flux spraying system and method thereof.

2. Description of Related Art

Flux spraying technologies are widely and commonly employed in production of electronic devices. Traditional flux machines spray flux onto printed circuit boards (PCBs) by use of a fixture with a plurality of openings corresponding to target areas on the PCBs. Generally, flux sprayers of the flux machines coat the entire surface of the fixture so as to ensure that the target areas on the PCBs are fully sprayed with flux through the openings in the fixture, which results in a waste of flux material.

Therefore, a need exists in the industry to overcome the described limitations.

DETAILED DESCRIPTION

All of the processes described may be embodied in, and fully automated via, software code modules executed by one or more general purpose computers or processors. The code modules may be stored in any type of computer-readable medium or other storage device. Some or all of the methods may alternatively be embodied in specialized computer hardware or communication apparatus.

Figure 1:
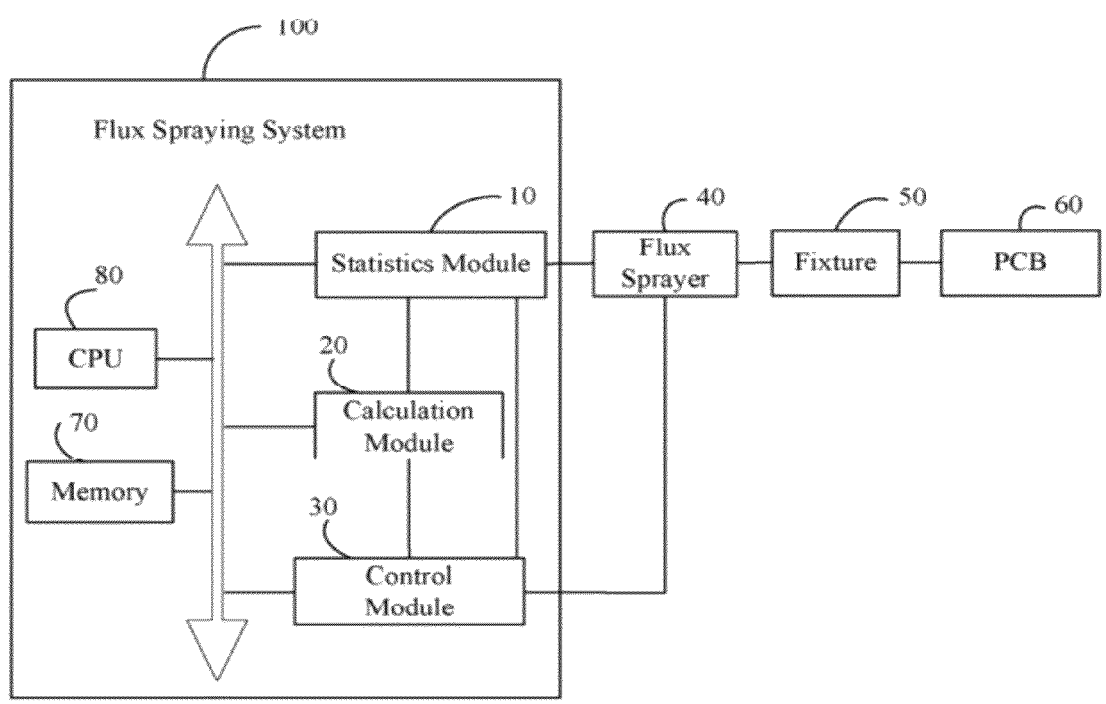
FIG. 1 is a schematic diagram of an application environment and functional modules of a flux spraying system in accordance with an exemplary embodiment of the disclosure.

FIG. 1 is a schematic diagram of an application environment and functional modules of a flux spraying system 100 in accordance with an exemplary embodiment of the disclosure. The flux spraying system 100 is operable to control a flux sprayer 40 to selectively spray flux onto a printed circuit board (PCB) 60 by use of a fixture 50 disposed between the PCB 60 and the flux sprayer 40. The fixture 50 comprises a plurality of openings corresponding to target areas on the PCB 60. In the illustrated embodiment, the plurality of openings in the fixture 50 are configured to allow the flux pass through, so as to spray the flux on the target areas on the PCB 60. The flux spraying system 100 comprises one or more programs stored in a memory 70 and executed by a central processing unit (CPU) 80.

In this embodiment, the flux spraying system 100 comprises a statistics module 10, a calculation module 20, and a control module 30.

The statistics module 10 records basic information and opening information on the fixture 50, and determines spraying areas on the fixture 50 according to the opening information of the fixture 50. In the illustrated embodiment, the basic information comprises, but is not limited to, a length, a width, a height, and a movement speed V1 of the fixture 50. The opening information comprises, but is not limited to, a quantity, position data, and area data of the openings.

The calculation module 20 calculates a velocity V2 and spray width of the flux sprayer 40 according to the spraying areas determined by the statistics module 10 and the moving speed V1 of the fixture 50. Subsequently, the calculation module 20 calculates a movement length during a movement period of the flux sprayer 40 based on the length and the width of the fixture 50, and the spray width of the flux sprayer 40. In the embodiment, the movement period of the flux sprayer 40 refers to a circle of the flux sprayer 40 moving away from an original position and back to the original position.

The calculation module 20 calculates spraying segments of the flux sprayer 40 during each movement period based on the moving speed V1 of the fixture 50 and the area data of the openings, and the velocity V2 and the spray width of the flux sprayer 40. In the embodiment, the spraying segments refer to path segments of the flux which are sprayed by the flux sprayer 40 to coat the PCB 60 with the flux. Particularly, the area data of the openings comprises length data and width data of the openings, respectively, and the position data of the openings comprises ordinate data of the openings on the fixture 50.

Additionally, the calculation module 20 calculates a spray duration of the job based on the movement length during each movement period and the spraying segments of the flux sprayer 40. In the embodiment, the spray duration comprises a spray initialization and a spray completion.

In the illustrated embodiment, the calculation module 20 determines the spray initialization based on the opening information of the fixture 50 and the movement length during each movement period of the flux sprayer 40, and determines the spray completion corresponding to the spray initialization according to the opening information of the fixture 40 and the spraying segments of the flux sprayer 40. Based on the determined spray initialization and spray completion, the calculation module 20 calculates the spray duration of the flux sprayer 40.

The control module 30 directs the flux sprayer 40 to move according to the movement length during each movement period and to selectively coat the target areas on the PCB 60 through the fixture 50 according to the spray duration of the flux sprayer 40.

During spraying, the flux sprayer 40 and the fixture 50 move synchronously, and movement directions of the flux sprayer 40 and the fixture 50 are perpendicular to each other.

Figure 2:
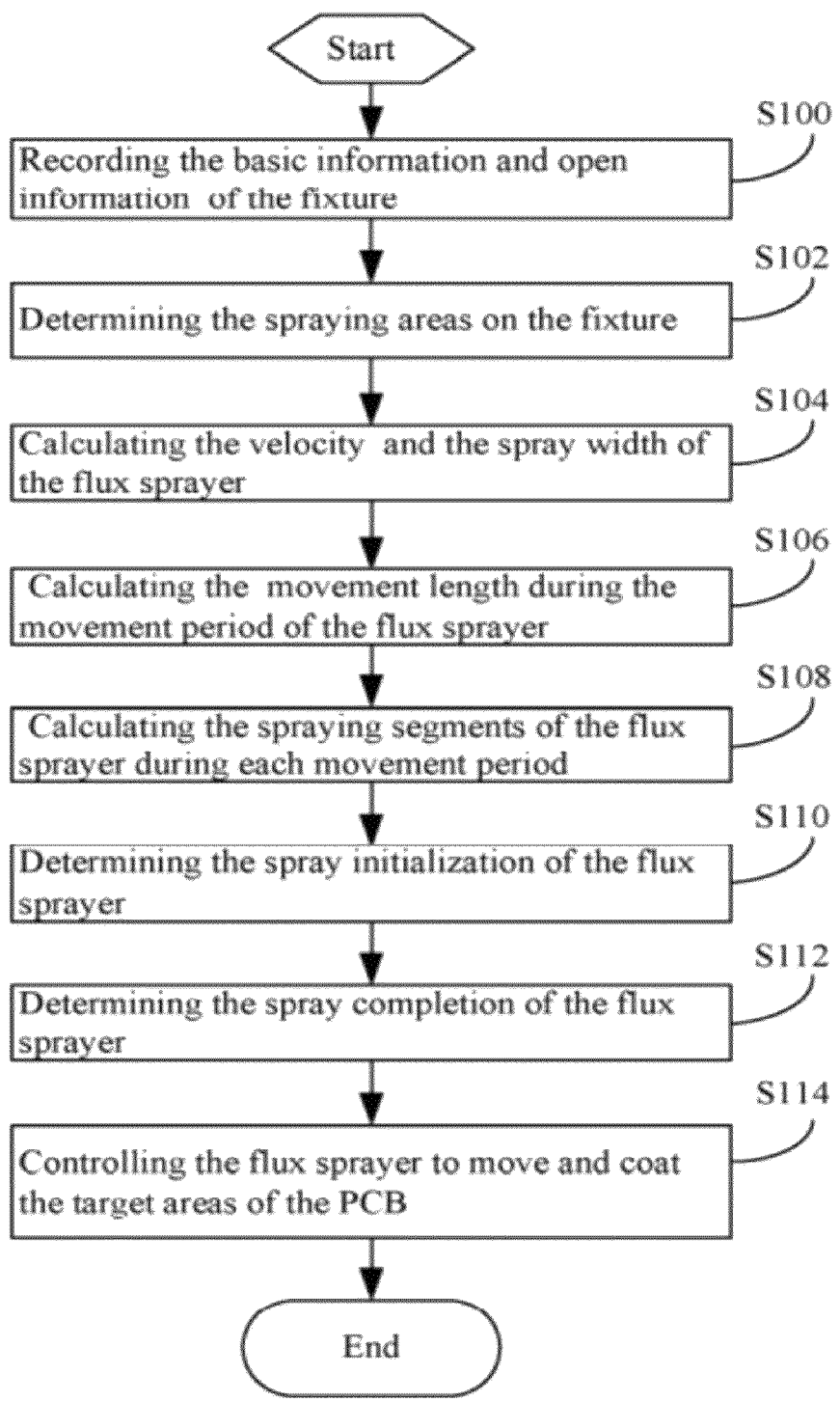
FIG. 2 is a flowchart of a flux spraying method utilized by a flux spraying system such as, for example, that illustrated in FIG. 1.

FIG. 2 is a flowchart of a soldering flux spraying method utilized by the flux spraying system 100 of the disclosure. Depending on the embodiment, additional blocks may be added, others deleted, and the ordering of the blocks may change.

In block S100, the statistics module 10 records the basic information and the opening information on the fixture 50.

In block S102, the statistics module 10 determines the spraying areas on the fixture 50 according to the opening information of the fixture 50.

In block S104, the calculation module 20 calculates the velocity V2 and the spray width of the flux sprayer 40 according to the spraying areas on the fixture 50 and the moving speed V1 of the fixture 50.

In block S106, the calculation module 20 calculates the movement length during each movement period of the flux sprayer 40 based on the length and width of the fixture 50 and the spray width of the flux sprayer 40.

In block S108, the calculation module 20 calculates the spraying segments of the flux sprayer 40 based on the movement speed V1 of the fixture 50, the area data of the openings, and the velocity V2 and the spray width of the flux sprayer 40.

In block S110, the calculation module 20 determines the spray initialization based on the opening information of the fixture 50 and the movement length during each movement period of the flux sprayer 40.

In block S112, the calculation module 20 determines the spray completion corresponding to the spray initialization based on the opening information of the fixture 50 and the spraying segments of the flux sprayer 40 during each movement period.

In block S114, the control module 30 directs the flux sprayer 40 to move according to the movement length during each movement period of the flux sprayer 40 and selectively coat flux onto the target areas on the PCB 60 through the openings of the fixture 50 according to the spray initialization and the spray completion during each movement period of the flux sprayer 40.

Figure 3A:
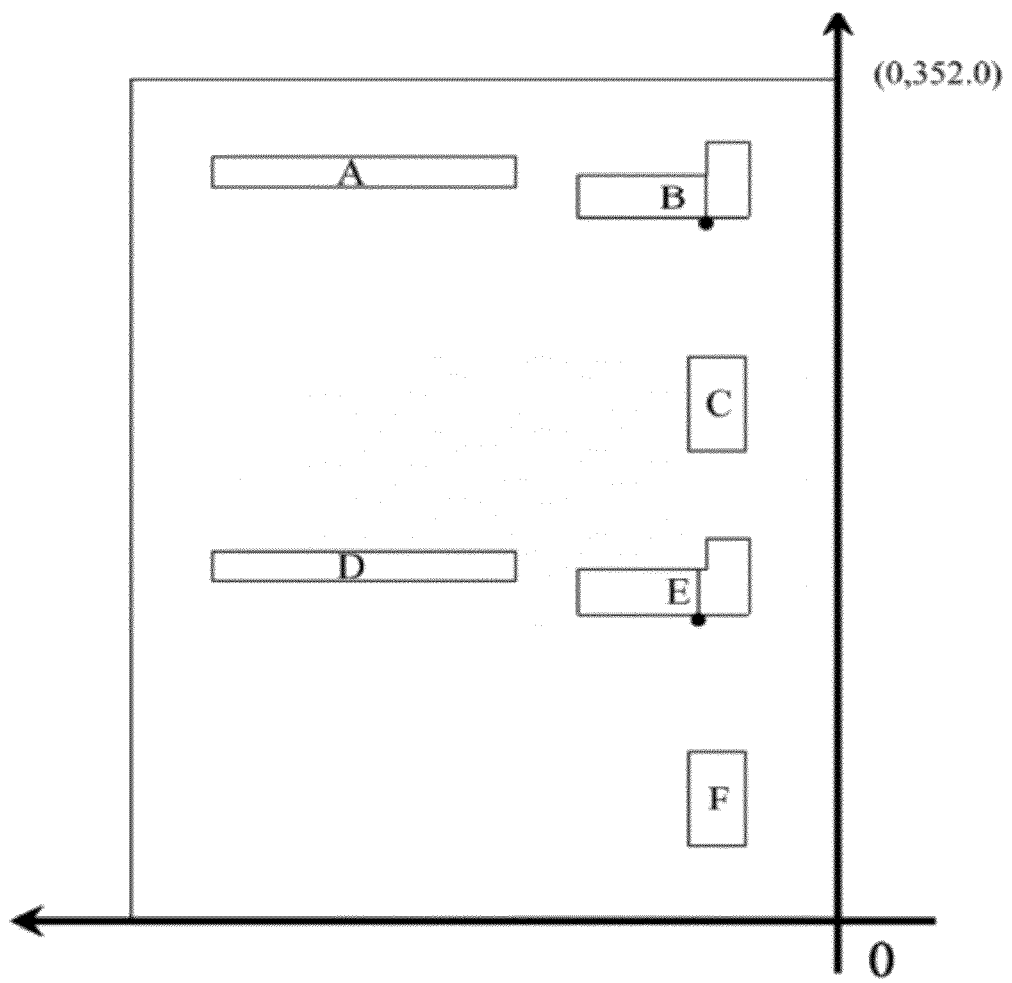
FIG. 3A-B are schematic diagrams of exemplary locations of the spraying areas on the fixture in the flux spraying method of the disclosure.
Figure 3B:
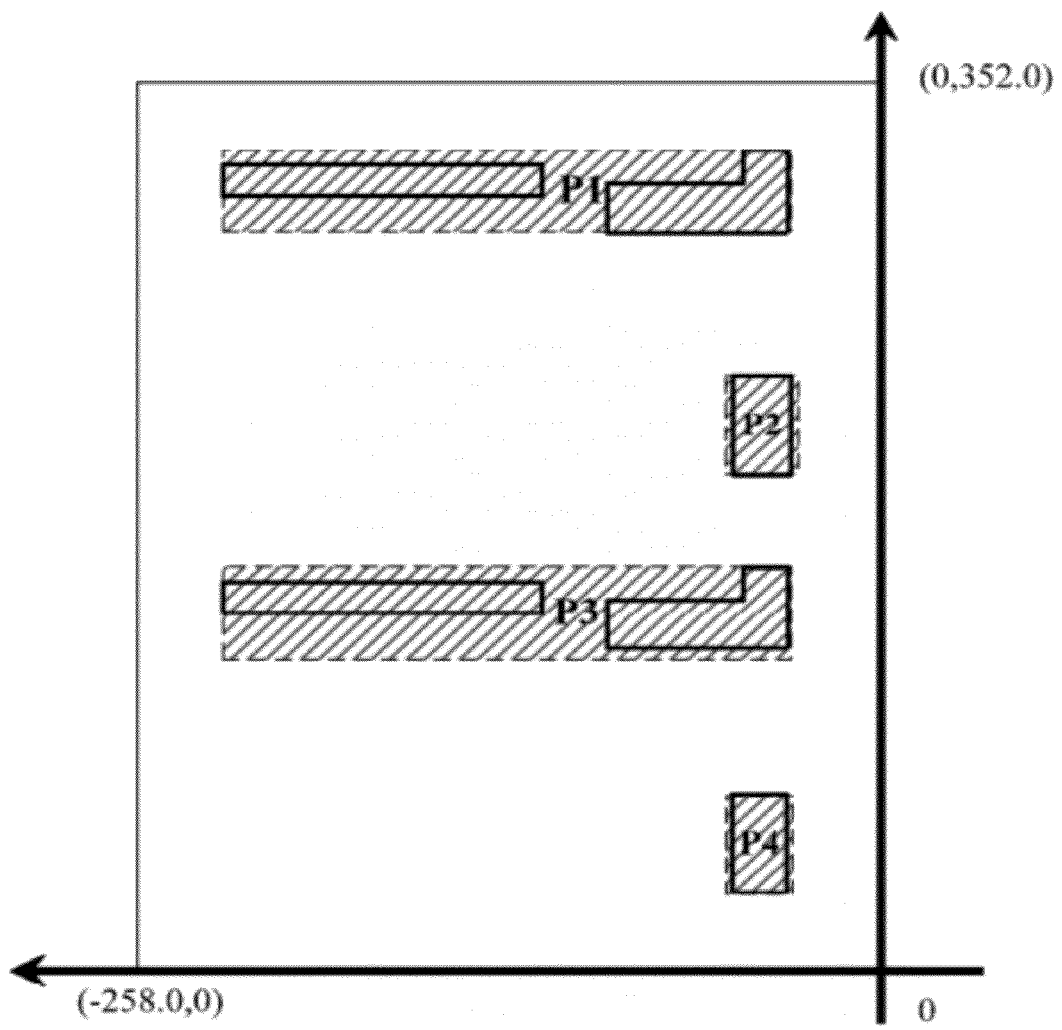

FIG. 3A-B are schematic diagrams of exemplary locations of the spraying areas on the fixture 50 of the flux spraying system 100 of the disclosure. In particular, FIG. 3A is a schematic diagram of the fixture 50 without division of the spraying areas. In the illustrated embodiment, the fixture 50 comprises six openings, respectively labeled as A, B, C, D, E, and F. FIG. 3B is a schematic diagram of the fixture 50 with division of the spraying areas. The statistics module 40 determines the spraying areas on the fixture 50, respectively labeled as P1, P2, P3 and P4 in FIG. 3B, based on the quantity, the position data and the area data of the openings A, B, C, D, E, and F.

Figure 4:
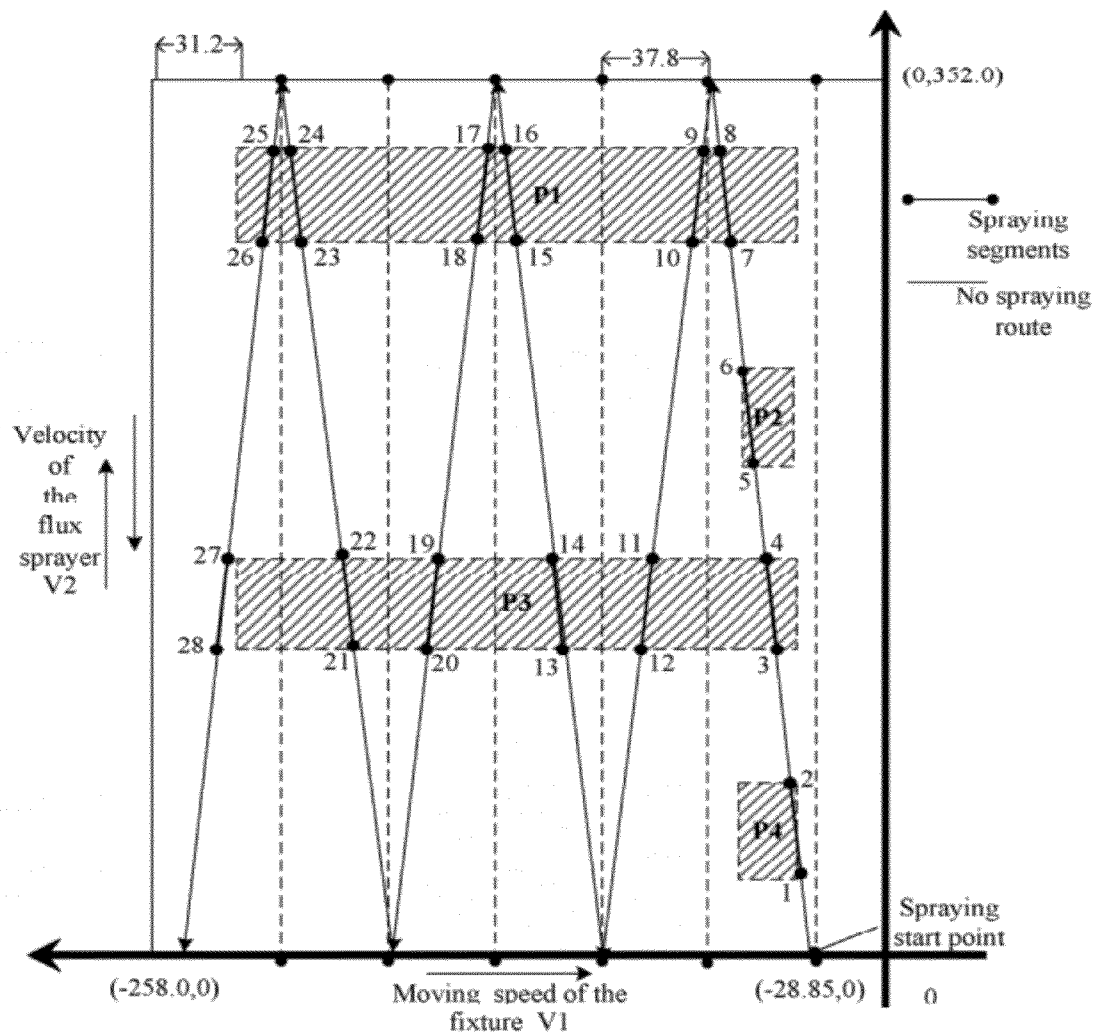
FIG. 4 is a schematic diagram of one example of a delivery route of a flux sprayer of the flux spraying method of the disclosure.

FIG. 4 shows a schematic diagram of one example of a delivery route of the flux sprayer 40 corresponding to the spraying areas P1, P2, P3 and P4 of the fixture 50 illustrated in FIG. 3B.

In use, as described above, the calculation module 20 calculates the movement length during one movement period of the flux sprayer 40 based on the length and width of the fixture 50 and the spray width of the flux sprayer 40. In the illustrated embodiment, the movement length during each movement period of the flux sprayer 40 approximately equals a doubled length of a broken line illustrated in FIG. 4. The calculation module 20 determines spray initializations of the flux sprayer 40 for the spraying areas P1, P2, P3 and P4 according to the position data of the spraying areas P1, P2, P3 and P4, and the movement length during one movement period of the flux sprayer 40. In the illustrated embodiment, when the flux sprayer 40 moves at the positions of the odd number points, such as points 1, 3, 5, etc, as shown in FIG. 4, the flux sprayer 40 begins to spray flux onto the target areas on the PCB 50 through the openings on the fixture 50.

The calculation module 20 determines spray completions for the spraying areas P1, P2, P3 and P4 bases on the spraying segments of the flux sprayer 40 during each movement period. In the embodiment, when the flux sprayer 40 moves at the positions of the even number points, such as points 2, 4, 6, etc., as shown in FIG. 4, the flux sprayer 40 completes spraying.

The control module 30 directs the flux sprayer 40 to move back and forth at the velocity V2. The fixture 50 moves at the moving speed V1 with direction perpendicular to direction of velocity V2 of the flux sprayer 40. In the illustrated embodiment, the fold lines illustrated in FIG. 4 are the delivery route of the flux sprayer 40.

The flux spraying system 100 of the disclosure directs the flux sprayer 40 to selectively spray flux onto the target areas on the PCB 60 through openings in the fixture 50, which results in savings of the flux material.

While the exemplary embodiment has been described, it should be understood that it has been presented by way of example only and not by way of limitation. The breadth and scope of the disclosure should not be limited by the described exemplary embodiments, but only in accordance with the following claims and their equivalent.

What is claimed is:

1. A flux spraying system operable to control a flux sprayer to selectively spray flux onto a printed circuit board (PCB) by use of a fixture disposed between the PCB and the flux sprayer, the fixture comprising a plurality of openings corresponding to target areas of the PCB, the flux spraying system comprising one or more programs stored in a memory and executed by a central processing unit, wherein the one or more programs comprise:

a statistic module configured to record basic information and opening information of the fixture so as to determine spraying areas on the fixture according to the opening information of the fixture, wherein the basic information comprises height, width, length, and moving speed of the fixture, and the opening information comprises a quantity, position data, and area data of the plurality of openings;

a calculation module configured to:
calculate a velocity and spray width of the flux sprayer according to the spraying areas on the fixture and the moving speed of the fixture;
calculate a movement length during a movement period of the flux sprayer according to the length and the width of the fixture and the spray width of the flux sprayer;
calculate spraying segments during each movement period of the flux sprayer according to the moving speed of the fixture, the area data of the openings, the velocity and the spray width of the flux sprayer, to determine a spray initialization of the flux sprayer based on the opening information and the movement length during the movement period of the flux sprayer; and
determine a spray completion corresponding to the spray initialization of the flux sprayer based on the opening information and the spraying segments during the movement period of the flux sprayer; and a control module configured to direct the flux sprayer to move according to the movement length during the movement period of the flux sprayer and to coat the target areas on the PCB with the flux through the plurality of openings of the fixture according to the spray initialization and the spray completion during each movement period.

2. The flux spraying system as claimed in claim 1, wherein the position data of the openings comprises ordinate data of the plurality of openings on the fixture.

3. The flux spraying system as claimed in claim 1, wherein the area data of the openings comprises length data and width data of the plurality of openings, respectively.

4. A flux spraying method utilized by a flux spraying system operable to control a flux sprayer to selectively spray soldering flux onto a printed circuit board (PCB) by use of a fixture disposed between the PCB and the flux sprayer, the fixture comprising a plurality of openings corresponding to target areas of the PCB, the soldering flux spraying method comprising:

recording basic information and opening information of the fixture, wherein the basic information comprises height, width, length, and moving speed of the fixture, and the opening information comprises a quantity, position data and area data of the plurality of openings in the fixture;

determining spraying areas on the fixture according to the opening information of the fixture;

calculating a velocity and spray width of the flux sprayer according to the spraying areas on the fixture and the moving speed of the fixture;

calculating a movement length during a movement period of the flux sprayer according to the length and the width of the fixture, and the spray width of the flux sprayer;

calculating spraying segments of the flux sprayer according to the moving speed of the fixture, the area data of the plurality of openings, and the velocity and the spray width of the flux sprayer;

determining a spray initialization of the flux sprayer based on the opening information of the fixture and the movement length during the movement period of the flux sprayer;

determining a spray completion corresponding to the spray initialization of the flux sprayer based on the opening information of the fixture and the spraying segments of the flux sprayer; and controlling the flux sprayer to move according to the movement length during the movement period of the flux sprayer and to coat the target areas on the PCB with the flux through the plurality of openings according to the spray initialization and the spray completion during each movement period.

5. The flux spraying method as claimed in claim 4, wherein the position data of the openings comprises ordinate data of the plurality of openings on the fixture.

6. The flux spraying method as claimed in claim 4, wherein the area data of the openings comprises length data and width data of the plurality of openings, respectively.

* * * * *